United States Patent [19]

Schulze

[11] Patent Number: 5,610,415

[45] Date of Patent: Mar. 11, 1997

[54] TURN-OFF SEMICONDUCTOR COMPONENT HAVING AMPHOTERIC PROPERTIES

[75] Inventor: Hans-Joachim Schulze, Ottobrunn, Germany

[73] Assignee: Siemens Aktiengesellschaft, Munich, Germany

[21] Appl. No.: 528,534

[22] Filed: Sep. 14, 1995

[30] Foreign Application Priority Data

Sep. 30, 1994 [DE] Germany .......................... 44 35 079.1

[51] Int. Cl.⁶ .................................................. H01L 29/74
[52] U.S. Cl. ...................... 257/149; 257/139; 257/148; 257/152; 257/607
[58] Field of Search ................................ 257/147, 148, 257/149, 607, 152, 156, 610, 139, 155, 102

[56] References Cited

U.S. PATENT DOCUMENTS

| | | | |
|---|---|---|---|
| 3,938,173 | 2/1976 | Jackson et al. | 257/117 |
| 4,035,205 | 7/1977 | Lebailly et al. | 257/102 |
| 4,356,503 | 10/1982 | Shafer et al. | 257/148 |
| 4,450,467 | 5/1984 | Nagano et al. | 257/149 |

OTHER PUBLICATIONS

Correlation Betwen Local Segment Characteristics and Dynamic Current Redistribution in GTO Power Thyristors--IEEE Transactions on Electron Devices, vol. 41, No. 5, May 1994.

*Primary Examiner*—Sara W. Crane
*Assistant Examiner*—David B. Hardy
*Attorney, Agent, or Firm*—Hill, Steadman & Simpson

[57] ABSTRACT

In turn-off semiconductor components such as GTO thyristors, the semiconductor body can be locally overheated and destroyed as a consequence of inhomogeneities. The anode-side emitter is therefore doped with additional substances that locally compensate the emitter doping above the operating temperature and locally reduce the current amplification factor of the anode-side transistor structure. An increased turn-off current is thus achieved.

11 Claims, 1 Drawing Sheet

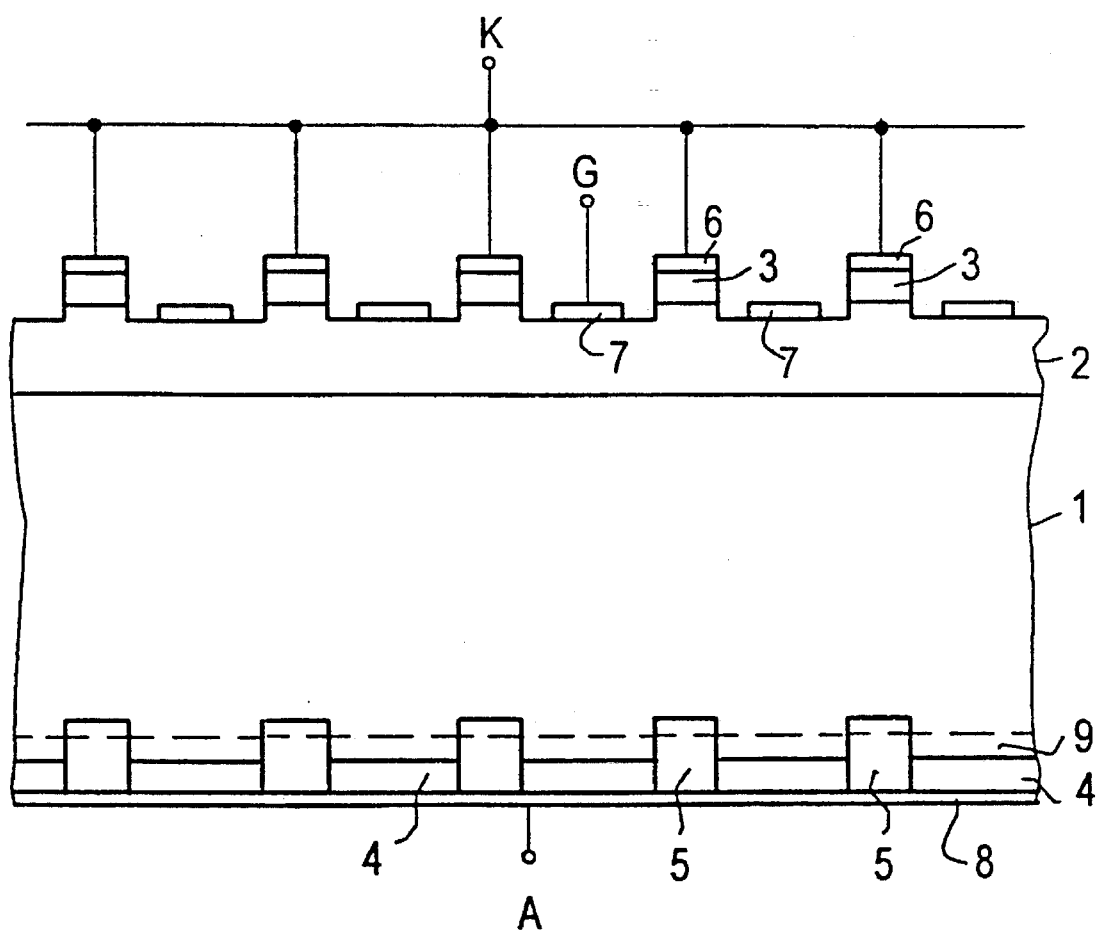

TURN-OFF SEMICONDUCTOR COMPONENT HAVING AMPHOTERIC PROPERTIES

BACKGROUND OF THE INVENTION

The invention is directed to a turn-off semiconductor component having a semiconductor body with at least one first emitter zone of first conductivity type, at least one base zone of second conductivity type adjacent to the first emitter zone, an inner zone of the first conductivity type adjacent to the base zone, and at least one second emitter zone of the second conductivity type adjacent to the inner zone and that has a given doping concentration of first substances.

When turning semiconductor components of the recited type off, such as, for example, GTO thyristors or IGBTs, regions having increased current density, what are referred to as current lines or filaments, can occur due to inhomogeneities. When the current density becomes extremely high, the semiconductor body can be destroyed by overheating.

SUMMARY OF THE INVENTION

An object of the invention is to improve a turn-off semiconductor component of said type such that the inhomogeneities present in the semiconductor body do not cause any locally significantly increased current density upon turn-off.

This object is achieved in that at least the second emitter zone is doped with additional substances that act as dopants of the first conductivity type above the operating temperature of the semiconductor component.

BRIEF DESCRIPTION OF THE DRAWING

The drawing FIGURE represents a section through a semiconductor body of a GTO thyristor.

DESCRIPTION OF THE PREFERRED EMBODIMENTS

The semiconductor body of the GTO thyristor of the drawing FIGURE has an inner zone 1 of the first conductivity type. A base zone 2 of the second conductivity type adjoins the inner zone 1. First emitter zones 3 that are of the same conductivity type as the inner zone, but which are significantly more highly doped than it adjoin the base zone 2. A second emitter zone 4, which is again of the second conductivity type, lies at the side opposite the base zone 2. The second emitter zone 4 is punctured by short-circuit zones 5 that have the same conductivity type as the inner zone 1, but have a higher doping than it. The short-circuit zones 5 usually have a greater depth than the second emitter zone 4.

The first emitter zones 3 are connected to emitter electrodes 6 that are connected parallel to one another. The second emitter zones and the short-circuit zones 5 are connected to an electrode 8. The base zone 2 is contacted to a control electrode 7. It is connected to a control terminal G. In a GTO thyristor, the zone sequence from the first emitter zones 3 up to the second emitter zone 4 is usually npnp. The electrodes 6 thus form the cathode terminal K and the electrode 8 forms the anode terminal A.

When such a GTO thyristor is turned off proceeding from the conductive condition, current lines or filaments where the current density is locally substantially higher than in the rest of the semiconductor body can form due to the initially cited, unavoidable inhomogeneities in the semiconductor body. The current density can become so high therein that the semiconductor body melts. In order to avoid these current lines or filaments, at least the second emitter 4 is then doped with additional substances in addition to the standard dopants of the second conductivity type such as, for example, boron. These dopants are selected such that they act as dopants of the first conductivity type above the operating temperature, i.e. at 300° C. and above, whereas they are electrically active to only a relatively slight extent at the normal operating temperature. For the standard case where the second emitter zone is p-doped, these additional substances must thus have donor properties at 300° C. Molybdenum, niobium, cesium or barium, for example, come into consideration as additional substances having such donor properties. In that case wherein the opposite zone sequence is present and the second emitter 4 is n-doped, the additional substances must have acceptor properties above the operating temperature. Cadmium, zinc, gold, or nickel, fix example, are substances suitable therefor.

What these substances have in common is that, dependent on the doping concentration of the first substances, they partially or entirely compensate the doping of the emitter zone 4 above the operating temperature, i.e. at about 300° C. and above. For a complete compensation of the first dopants present in the second emitter zone 4, the doping concentration of the additional substances should be as high as that of the first substances.

The additional substances thus have a compensating effect when the current lines or filaments form and the temperature therein rises. The emitter efficiency of the sub-transistor of the anode side composed of the zones 2, 1 and 4 is therefore locally reduced in the current lines. The reduction of the current amplification factor corresponds to a reduction of the current flowing in these lines or filaments upon turn-off, so that the turn-off current becomes more uniform overall.

The additional substances, however, can also be introduced beyond the second emitter into the adjoining region of the inner zone 1. However, they should not be introduced more deeply than the depth of the short-circuits 5, i.e., for example, down to a depth that is illustrated by the broken line 9. Given a temperature elevation in the lines or filaments, the additional substances act like an increase in the doping in the region of the inner zone 1 adjoining the second emitter zone 4. Since the current amplification is dependent on the ratio of the dopant concentration at both sides of the pn-junction, boosting the dopant concentration in the region of the inner zone 1 and lowering the effective dopant concentration in the zone 4 effects an overall reduction of the current amplification factor within the current lines or filaments. As a result thereof, the current amplification factor of the anode side in the current lines or filaments can be reduced to zero. The lines or filaments thus disappear, the temperature drops, and the current amplification factor of the anode side can rise again until an equilibrium is established. A significantly more uniform turn-off current then flows to the control electrode 7 in this condition.

The remaining region of the inner zone 1, the base zone 2 and the first emitter zone 3 remain free of additional substances. A doping of the short-circuit zones 5 with the additional substances does not deteriorate their effect.

Although various minor changes and modifications might be proposed by those skilled in the art, it will be understood that I wish to include within the claims of the patent warranted hereon all such changes and modifications as reasonably come within my contribution to the art.

I claim as my invention:

1. A turn-off semiconductor component, comprising:

a semiconductor body with at least one first emitter zone of first conductivity type, at least one base zone of second conductivity type adjacent to the first emitter zone, an inner zone of first conductivity type adjacent to the base zone, and at least one second emitter zone of second conductivity type adjacent to the inner zone and that has a given doping concentration of first substances; and at least the second emitter zone being doped with additional substances that act as dopants of first conductivity type above a normal operating temperature of the semiconductor component, but which do not substantially act as first conductivity dopants at said operating temperature, so that if a locally significant increased current density occurs in current lines at turn-off, a temperature in said current lines, which is higher than the normal operating temperature, will cause said additional substances to act as the first conductivity dopants so as to reduce current flow in said current lines and make turn-off current more uniform overall.

2. A semiconductor component according to claim 1 wherein the second emitter zone is p-doped, and the additional substances have donor properties above the operating temperature.

3. A semiconductor component according to claim 2 wherein the additional substances are at least one of the substances selected from the group consisting of molybdenum, niobium, cesium, barium.

4. A semiconductor component according to claim 1 wherein the second emitter zone is n-doped, and the additional substances have acceptor properties above the operating temperature.

5. A semiconductor component according to claim 4 wherein the additional substances are at least one of the substances selected from the group consisting of cadmium, zinc, gold, nickel.

6. A semiconductor component according to claim 1 wherein the inner zone is also doped with the additional substances at a side adjacent to the second emitter zone.

7. A semiconductor component according to claim 6 wherein short-circuit zones that extend to a surface of the semiconductor body are arranged at a side of the second emitter zone, said short-circuit zones having a conductivity type opposite that of the second emitter zone and having a predetermined depth; and the inner zone being doped with the additional substances up to a depth that is less than said predetermined depth.

8. A semiconductor component according to claim 1 wherein a doping concentration of the additional substances is at least equal to a doping concentration of the first substances.

9. A turn-off semiconductor component, comprising:

a semiconductor body with at least one first emitter zone of first conductivity type, at least one base zone of second conductivity type adjacent to the first emitter zone, an inner zone of first conductivity type adjacent to the base zone, and at least one second emitter zone of second conductivity type adjacent to the inner zone;

a cathode connecting to the at least one first emitter zone via an electrode, a control terminal connecting through a control electrode to said at least one base zone, an anode terminal connecting through an anode electrode to said second emitter zone, and at least one short circuit zone extending from said anode terminal electrode through said second emitter zone into said inner zone; and at least the second emitter zone being doped with at least one substance that acts as a dopant of first conductivity type above a normal operating temperature of the semiconductor component to locally compensate second emitter zone doping above the operating temperature and locally reduce a current amplification factor at said anode electrode in current lines having increased current density, a temperature in said current lines which is higher than said normal operating temperature, causing said at least one substance to act as the first conductivity dopant so as to reduce current flow in said current lines, said at least one substance substantially not acting as a first conductivity dopant at said normal operating temperature outside of said increased current density current lines.

10. A semiconductor component according to claim 9 wherein a plurality of said first emitter zones are provided, each having its own electrode, and a plurality of said short circuit zones are provided.

11. A semiconductor component according to claim 10 wherein said at least one substance that acts as a dopant of first conductivity type above said operating temperature is introduced not only in said second emitter zone but also in said inner zone to a depth which is less than a depth to which said short circuit zones extend into said inner zone.

* * * * *